(12) United States Patent
Chang

(10) Patent No.: US 10,312,879 B2
(45) Date of Patent: Jun. 4, 2019

(54) AUDIO CONTROL CIRCUIT

(71) Applicant: ANPEC ELECTRONICS CORPORATION, Hsinchu (TW)

(72) Inventor: Che-Chang Chang, Hsinchu County (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 208 days.

(21) Appl. No.: 15/432,351

(22) Filed: Feb. 14, 2017

(65) Prior Publication Data

US 2018/0152165 A1 May 31, 2018

(30) Foreign Application Priority Data

Nov. 28, 2016 (TW) .............................. 105139080 A

(51) Int. Cl.
*H03G 7/00* (2006.01)
*H03G 3/30* (2006.01)
*H04R 29/00* (2006.01)

(52) U.S. Cl.
CPC ............. *H03G 7/004* (2013.01); *H03G 3/301* (2013.01); *H03G 3/3005* (2013.01); *H04R 29/004* (2013.01); *H04R 2430/01* (2013.01)

(58) Field of Classification Search
CPC ........ H03G 7/004; H03G 3/00; H03G 3/3005; H03G 3/301; H04R 29/004; H04R 2430/01

USPC .................... 381/56, 58, 102, 104, 120, 124
See application file for complete search history.

(56) References Cited

U.S. PATENT DOCUMENTS

| 2010/0266144 A1* | 10/2010 | Chiu | ....................... H03G 3/34 |
| | | | 381/106 |
| 2011/0121761 A1* | 5/2011 | Zhao | .................. H05B 33/0818 |
| | | | 315/312 |
| 2018/0132045 A1* | 5/2018 | Petrausch | ............ H04R 25/505 |

OTHER PUBLICATIONS

Jordandee, Pulse-Width Modulation, 2015.*

* cited by examiner

*Primary Examiner* — William A Jerez Lora
(74) *Attorney, Agent, or Firm* — Li & Cai Intellectual Property (USA) Office

(57) ABSTRACT

An audio control circuit is provided in the present disclosure. The audio control circuit includes an input module, a volume signal detecting module and a volume adjusting module. The input module is used for receiving an audio signal. The volume signal detecting module is used for receiving a volume control signal and generates a volume adjusting signal according to the volume control signal. The volume adjusting module is used for receiving the audio signal and the volume adjusting signals and generates an amplified audio signal according to the audio signal and the volume adjusting signal. The volume control signal is a pulse width modulation signal.

7 Claims, 5 Drawing Sheets

AUDIO CONTROL CIRCUIT

BACKGROUND OF THE INVENTION

1. Field of the Invention

The present disclosure relates to an audio control circuit; in particular, to an audio control circuit adopting pulse width modulation for volume control.

2. Description of Related Art

For electronic devices with music playing functions, pulse signals are usually used as the signal for volume control of the audio control chip. It is worth noting, however, that the volume control would thus be limited within a certain range, which precludes delicate controls and complicates circuit design.

Therefore, providing an audio control circuit capable of delicately adjusting the range of volume has become a critical issue in the industry.

SUMMARY OF THE INVENTION

The object of the present disclosure is to provide an audio control circuit. The audio control circuit includes an input module configured to receive an audio signal; a volume control signal detecting module including a duty cycle calculating unit, configured to receive a volume control signal, in which the duty cycle calculating unit calculates a duty cycle percentage of each period of the audio control signal according to a high level signal time and a low level signal time, and the volume control signal detecting module generates a volume adjusting signal according to the duty cycle percentage of each period of the audio control signal; and a volume adjusting module configured to receive the audio signal and the volume adjusting signal, and to generate an adjusted audio signal according to the audio signal and the volume adjusting signal; in which the volume control signal is a pulse width modulation signal.

The audio control circuit further includes a processing module configured to process a plurality of audio characteristics of the adjusted audio signal, and an output module configured to output the adjusted audio signal.

The volume control signal detecting module includes: a sampling unit configured to sample the audio control signal according to a clock signal, in which a frequency value of the clock signal is greater than a frequency value of the audio control signal; a high level counting unit configured to calculate a high level signal time of the high level signal of each period of the audio control signal; and a low level counting unit configured to calculate a low level signal time of the high level signal of each period of the audio control signal.

The audio control signal detecting module further includes: a clock signal providing unit configured to provide the clock signal to the sampling unit.

The clock signal providing unit includes a plurality of clock signals, and the plurality of clock signals have different frequency values respectively.

The audio control signal detecting module further includes: a reset unit, configured to reset the high level counting unit, the low level counting unit and the duty cycle calculating unit, according to a high level signal value detected by the high level counting unit or a low level signal value detected by the low level counting unit.

A frequency value of the audio control signal is greater than 20 KHz.

In order to achieve the aforementioned objects, according to an embodiment of the present disclosure, a volume adjusting method adopted for an audio control circuit is provided. The method includes: receiving an audio control signal and an audio signal; sampling the audio control signal according to a clock signal; calculating a duty cycle percentage of each period of the audio control signal, and providing a plurality of volume adjusting value corresponding to the duty cycle percentage of each period of the audio control signal; and adjusting the volume of the audio signal according to the audio adjusting value; in which the audio control signal is a pulse width modulation signal.

The step of calculating a duty cycle percentage of each period of the audio control signal further includes: calculating a high level signal time and a low level signal time of each period of the audio control signal; calculating the duty cycle percentage of each period according to the high signal time and the low level signal time of each period; and providing a plurality of volume adjusting values corresponding to the duty cycle percentage of each period of the audio control signal.

The audio control circuit as provided in the present disclosure is able to utilize a pulse width modulation signal for volume control, and only one single pin on the chip package is needed for the volume control, thus helping to lower the complexity of circuit design, and which, in addition to simplifying the design of perimeter circuits, also saves the cost.

In order to further the understanding regarding the present disclosure, the following embodiments are provided along with illustrations to facilitate the disclosure of the present disclosure.

DETAILED DESCRIPTION OF THE PREFERRED EMBODIMENTS

The aforementioned illustrations and following detailed descriptions are exemplary for the purpose of further explaining the scope of the present disclosure. Other objectives and advantages related to the present disclosure will be illustrated in the subsequent descriptions and appended drawings.

[Audio Control Circuit According to an Embodiment of the Present Disclosure]

Figure 1:
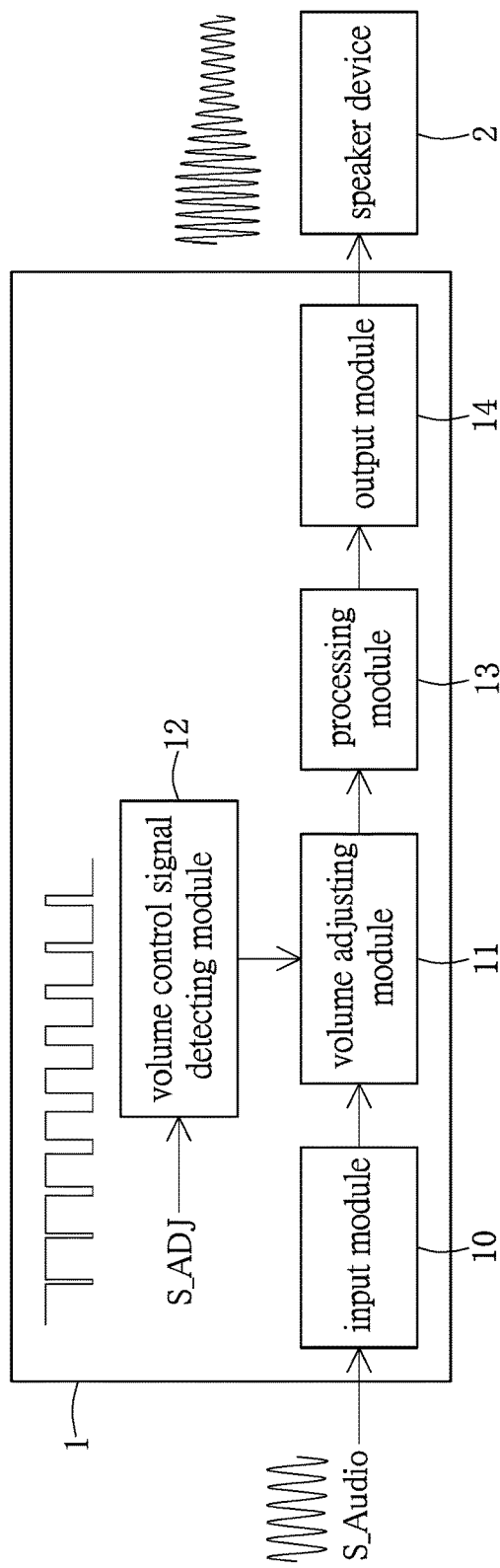
FIG. 1 shows a diagram of an audio control circuit and a speaker device according to an embodiment of the present disclosure.
Figure 2:
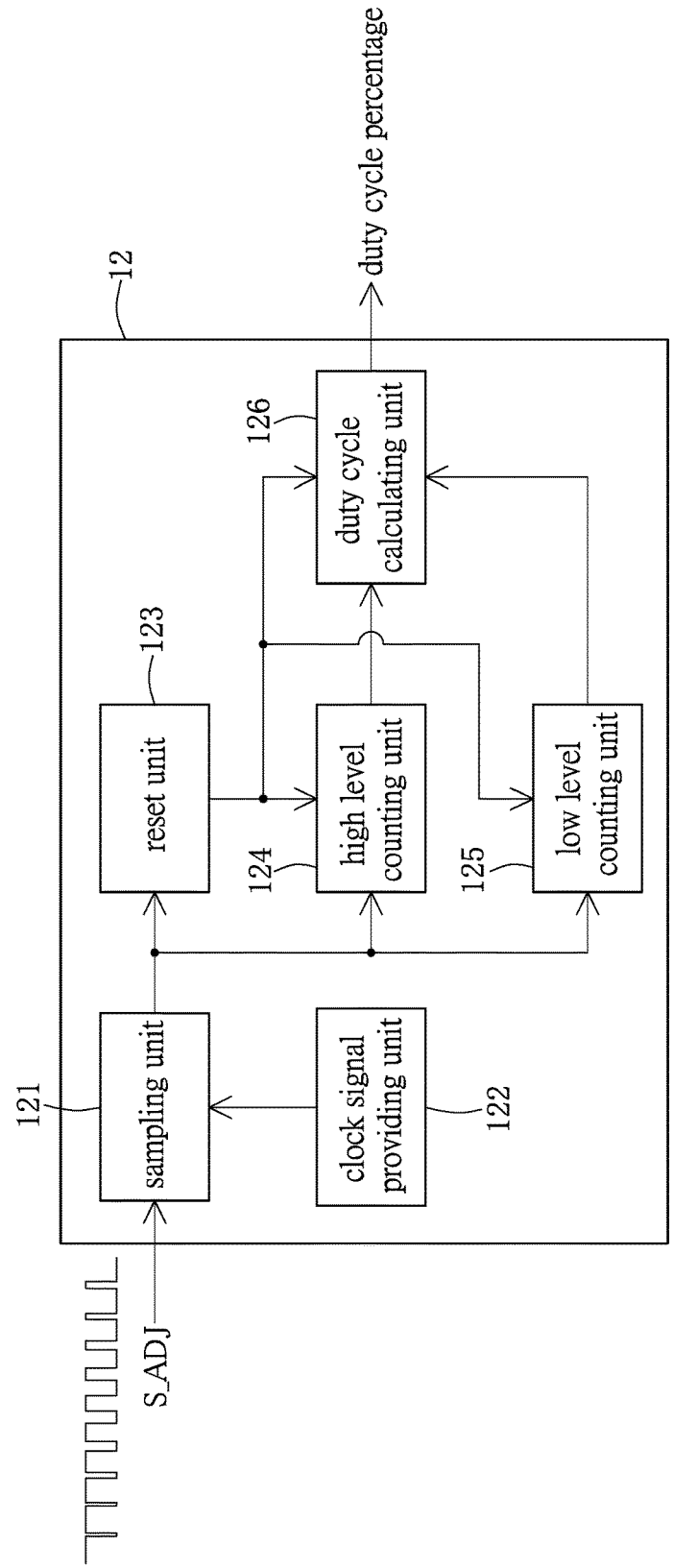
FIG. 2 shows a diagram of a volume control signal detecting module according to an embodiment of the present disclosure.

Reference is made to FIG. 1 and FIG. 2, where FIG. 1 shows a diagram of an audio control circuit and a speaker device according to an embodiment of the present disclosure and FIG. 2 shows a diagram of a volume control signal detecting module according to an embodiment of the present disclosure.

In the present embodiment, the audio control circuit 1 includes an input module 10, a volume adjusting module 11, a volume control signal detecting module 12, a processing module 13 and an output module 14.

The input module electrically connects with the volume adjusting module 11. The volume adjusting module 11 electrically connects with the processing module 13 and the volume control signal detecting module 12. The processing module 13 electrically connects with the output module 14. The output module 14 of the audio control circuit 1 electrically connects with a speaker device 2.

In the present embodiment, the input module 10 is configured to receive an audio signal S_Audio. The audio signal S_Audio may be, but not limited to, music, human voices or sound signals of any other kind. The audio signal S_Audio may also be, but not limited to, an analog signal or a digital signal.

The audio signal S_Audio is received by the input module 10, and after signal processing, which converts the sequence signal of the audio signal S_Audio into a signal form suitable for parallel processing, the audio signal S_Audio is sent to the volume adjusting module 11 for adjusting the volume. The volume control signal detecting module 12 is configured to receive a volume control signal S_ADJ, and the volume control signal detecting module 12 may generate a volume adjusting signal according to the volume control signal S_ADJ. The volume adjusting signal generated by the volume control signal detecting module 12 would be sent to the volume adjusting module 11. The volume adjusting module 11 is configured to receive the audio signal S_Audio and the volume adjusting signal, to adjust the volume of the audio signal S_Audio and to generate an adjusted audio signal. The adjusted audio signal is then sent to the processing module 13 for signal processing on all kinds of audio signal characteristics (e.g., sound quality).

In the present embodiment, the audio control signal S_ADJ is a pulse width modulation (PWM) signal. In other embodiments, the audio control signal S_ADJ may also be, but not limited to, a high level signal or a low level signal.

The volume control signal detecting module 12 includes a sampling unit 121, a clock signal providing unit 122, a reset unit 123, a high level counting unit 124, a low level counting unit 125 and a duty cycle calculating unit 126.

The clock signal providing unit 122 electrically connects with the sampling unit 121. The sampling unit 121 electrically connects with the reset unit 123, the high level counting unit 124 and the low level counting unit 125, respectively. The reset unit 123 electrically connects with the sampling unit 121, the high level counting unit 124, the low level counting unit 125 and the duty cycle calculating unit 126. The high level counting unit 124 electrically connects with the sampling unit 121, the reset unit 123 and the duty cycle calculating unit 126. The low level counting unit 125 electrically connects with the sampling unit 121 and the duty cycle calculating unit 126.

In the present embodiment, the volume control signal detecting module 12 is configured to receive the volume control signal S_ADJ. The volume control signal S_ADJ is a pulse width modulation (PWM) signal. The frequency value of the volume control signal S_ADJ is greater than 20 HKz in the present embodiment. Since audible frequencies for humans range from 20 Hz to 20 kHz, selecting a volume control signal S_ADJ with a frequency of above 20 kHz may effectively avoid the frequency range of noise audible to humans, and can also guarantee that the audio signal would not carry audible noises which could lead to distortion.

The sampling unit 121 samples the received volume control signal S_ADJ based on the clock signal provided by the clock signal providing unit 122. In order to ensure sampling accuracy, the frequency value of the clock signal provided by the clock signal providing unit 122 is at least 10 times that of the volume control signal S_ADJ. If the frequency value of the clock signal provided by the clock signal providing unit 122 is greater than 10 times that of the volume control signal S_ADJ, the sampling of the volume control signal S_ADJ would be more accurate. That is to say, the sampling unit 121 utilizes a sampling signal with higher frequency for segmentation and detection of small sections of the volume control signal S_ADJ, thereby obtaining signal characteristics of each period of the volume control signal S_ADJ.

In the present embodiment, the frequency value of the volume control signal S_ADJ is 25 KHz, and the frequency value of the clock signal provided by the clock signal providing unit 122 is 250 KHz, which is 10 times that of the volume control signal S_ADJ. In other embodiments, different frequency values of the clock signal provided by the clock signal providing unit 122 may be selected to meet different requirements, and should not be limited by that disclosed in the present disclosure.

In other embodiments, the clock signal providing unit 122 may include a plurality of clock signals, and the plurality of clock signals have different frequency values selectable according to practical demands. In other embodiments, the clock signal providing unit 122 may select a clock signal with a proper frequency value according to the volume control signal S_ADJ, so that it can be provided to the sampling unit 121 for sampling of the audio control signal S_ADJ.

In the present embodiment, since the volume control signal S_ADJ is a pulse width modulation signal, the high level counting unit 124 and the low level counting unit 125 of the volume control signal detecting module 12 may calculate the time period occupied respectively by a high level signal and a low level signal of each period of the volume control signal S_ADJ, which means the high level counting unit 124 and the low level counting unit 125, respectively, calculates a high level signal time and a low level signal time of each period. The high level counting unit 124 and the low level counting unit 125 then respectively transmits the high level signal time and the low level signal time to the duty cycle counting unit 126. The duty cycle counting unit 126 calculates the duty cycle of each period according to the following equation 1.

$$DutyCycle = \frac{T_{on}}{T_{on} + T_{off}} * 100\% \qquad \text{Equation 1}$$

In the equation above, $T_{on}$ is the high level signal time, $T_{off}$ is the low level signal time, and the period time T of each period of the volume control signal S_ADJ is the sum of the high level signal time $T_{on}$ and the low level signal time $T_{off}$. That is to say, the signal outputted by the volume control signal detecting module 12 is the plurality of volume adjusting values which the duty cycle percentage of each period of the volume control signal S_ADJ corresponds to. That is to say, the volume adjusting single generated by the volume control signal detecting module 12 according to the volume control signal S_ADJ is the duty cycle percentage of each period of the volume control signal S_ADJ. Different duty cycle percentages may correspond to one volume adjusting value. In the present embodiment, 128 volume adjusting values are used, which means 128 (2 to the $7^{th}$ power) volume adjusting values are available in the present embodiment. In other embodiments, adjustments may be made according to different demands, and should not be limited by that disclosed in the present disclosure.

The volume adjusting module 11 generates an adjusted audio signal according to the volume adjusting signal (i.e., the plurality of volume adjusting values) and the audio signal S_Audio. In the present embodiment, the volume adjusting module 11 multiplies the volume adjusting signal (i.e., the plurality of volume adjusting values) with the amplitude of the audio signal S_Audio to obtain the adjusted audio signal.

In the present embodiment, when the volume control signal S_ADJ is not a pulse width modulation signal (e.g., when the volume control signal S_ADJ is a high level signal), the high level counting unit 124 of the volume control signal detecting module 12 would start to count the number of detected high level signals, and if the number of detected high level signal exceeds a first predetermined amount, the reset unit 123 of the volume control signal detecting module 12 would reset the high level counting unit 124, the low level counting unit 125 and the duty cycle calculating unit 126. When the volume control signal S_ADJ is a low level signal, the low level counting unit 125 would continue to calculate the number of detected low level signals, and if the amounts of detected low level signals exceed a second predetermined amount, the reset unit 123 of the volume control signal detecting module 12 would reset the high level counting unit 124, the low level counting unit 125 and the duty cycle calculating unit 126. In the present embodiment, the reset conditions of the first predetermined amount and the second predetermined amount for the reset unit 123 may be designed according to practical demands, and should not be limited by that disclosed in the present disclosure.

In the present embodiment, the high level counting unit 124 detects the rising edge and the falling edge of the high level signal of the volume control signal S_ADJ (PWM signal) at each period as the starting point and the ending point of the high level signal of each period. In other embodiments, calculations can be made according to other waveform characteristics, and should not be limited by that disclosed in the present disclosure.

Figure 3A:
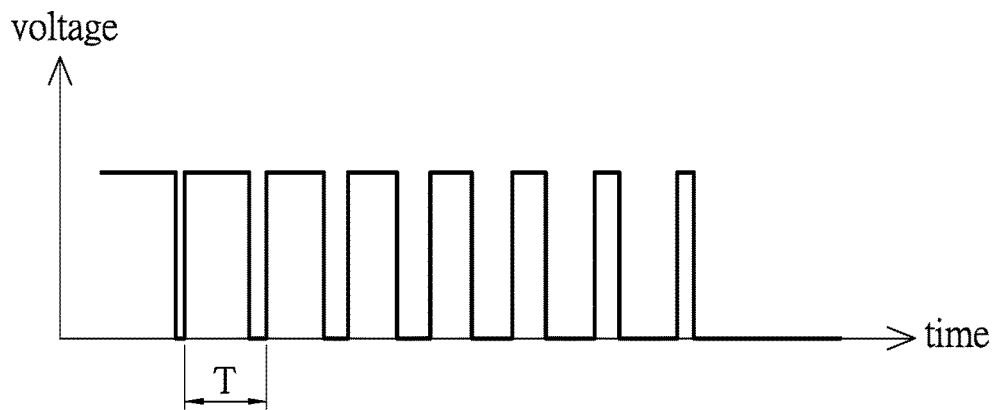
FIG. 3A shows a diagram of a volume control signal according to an embodiment of the present disclosure.
Figure 3B:
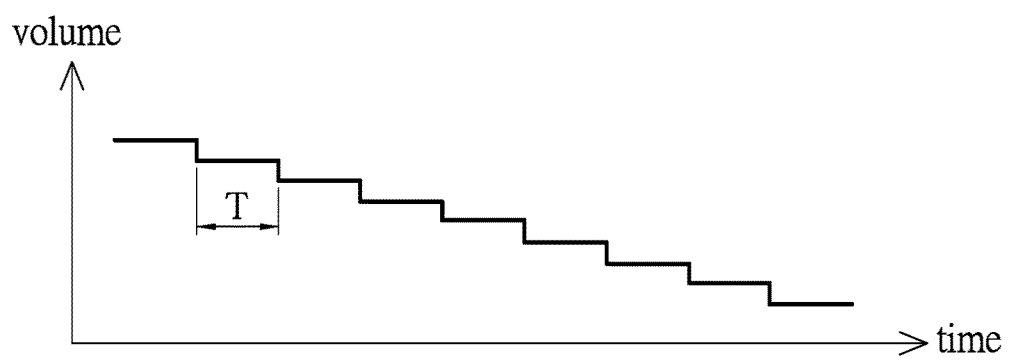
FIG. 3B shows a diagram of a volume control signal according to an embodiment of the present disclosure.
Figure 3C:
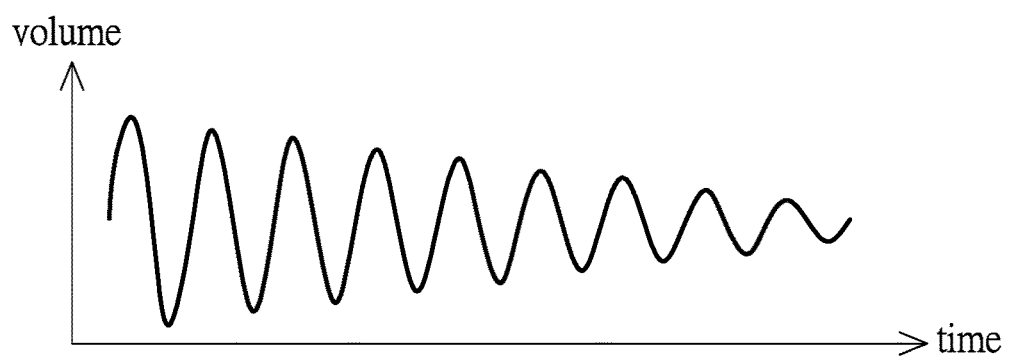
FIG. 3C shows a diagram of an adjusted audio signal according to an embodiment of the present disclosure.

Reference is next made to FIG. 3A, FIG. 3B and FIG. 3C, where FIG. 3A shows a diagram of a volume control signal according to an embodiment of the present disclosure, FIG. 3B shows a diagram of a volume control signal according to an embodiment of the present disclosure, and FIG. 3C shows a diagram of an adjusted audio signal according to an embodiment of the present disclosure.

FIG. 3A shows a diagram of a volume control signal, in which the duty cycle of each period time T decreases gradually such that the corresponding volume adjusting values shown in FIG. 3B appear to be in a form of decreasing steps. The amplitudes of the adjusted audio signals as shown in FIG. 3C decrease gradually as well.

[Volume Adjusting Method According to an Embodiment of the Present Disclosure]

Figure 4:
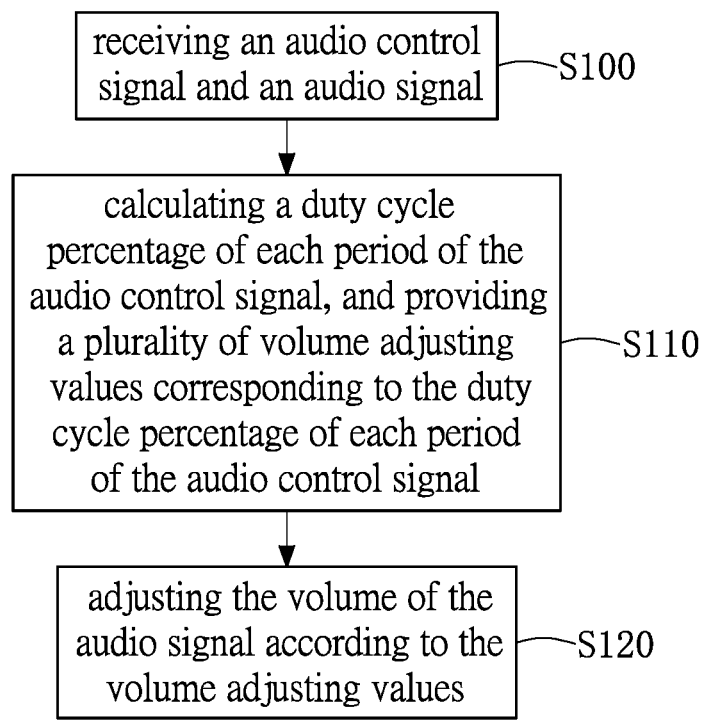
FIG. 4 shows a flowchart of a volume adjusting method according to an embodiment of the present disclosure.
Figure 5:
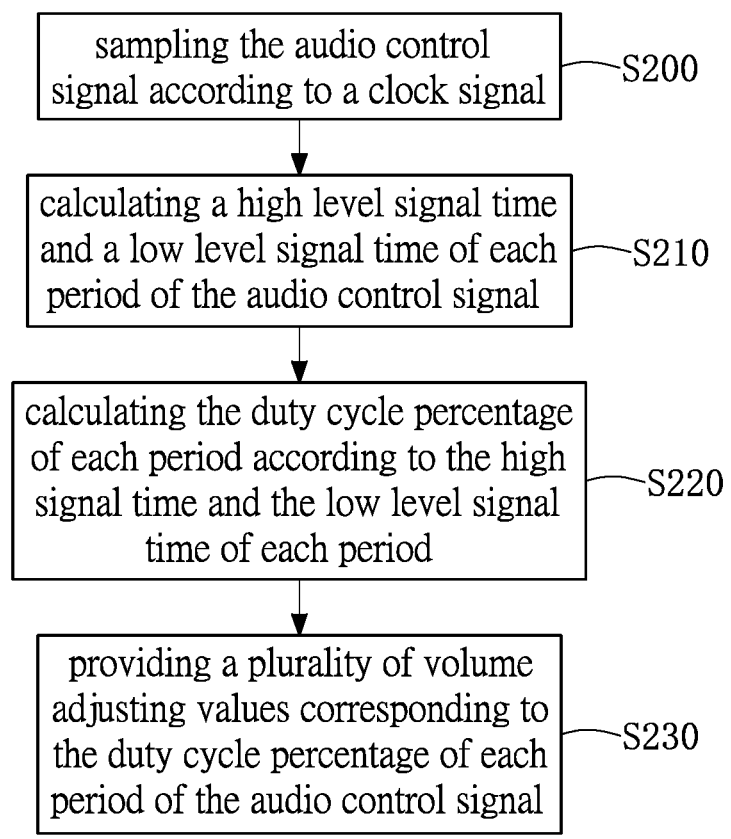
FIG. 5 shows a flowchart of a volume adjusting method according to another embodiment of the present disclosure.

Reference is made to FIG. 4 and FIG. 5, where FIG. 4 shows a flowchart of a volume adjusting method according to an embodiment of the present disclosure, and FIG. 5 shows a flowchart of a volume adjusting method according to another embodiment of the present disclosure.

The present embodiment provides a volume adjusting method adopted for an audio control circuit, which is the audio control circuit 1 as described in the previous embodiment, and thus the structure and function thereof are omitted herein for the sake of brevity.

The volume adjusting method of the present embodiment includes the following steps: receiving an audio control signal and an audio signal (step S100); calculating a duty cycle percentage of each period of the audio control signal, and providing a plurality of volume adjusting values corresponding to the duty cycle percentage of each period of the audio control signal (step S110); and adjusting the volume of the audio signal according to the audio adjusting value (step S120).

In step S100, the audio control signal is a pulse width modulation signal. In other embodiments, the audio control signal may be, but not limited to, a high level signal or a low level signal. The frequency value of the volume control signal S_ADJ is greater than 20 KHz in the present embodiment. Since audible frequencies for humans range from 20 Hz to 20 kHz, selecting a volume control signal S_ADJ with a frequency of above 20 kHz may effectively avoid the frequency range of noise audible to humans, and can also guarantee that the audio signal would not carry audible noises which could lead to distortion.

In step S110, the following steps are further included: sampling the audio control signal according to a clock signal (step S200); calculating a high level signal time and a low level signal time of each period of the audio control signal (step S210); calculating the duty cycle percentage of each period according to the high signal time and the low level signal time of each period (step S220); and providing a plurality of volume adjusting values corresponding to the duty cycle percentage of each period of the audio control signal (step S230).

In step S200, the sampling unit 121 of the volume control signal detecting module 12 samples the received volume control signal S_ADJ based on the clock signal provided by the clock signal providing unit 122. In order to ensure sampling accuracy, the frequency value of the clock signal provided by the clock signal providing unit 122 is at least 10 times that of the volume control signal S_ADJ. If the frequency value of the clock signal provided by the clock signal providing unit 122 is greater than 10 times the volume control signal S_ADJ, the sampling of the volume control signal S_ADJ would be more accurate. That is to say, the sampling unit 121 utilizes a sampling signal with higher frequency for segmentation and detection of small sections of the volume control signal S_ADJ, thereby obtaining signal characteristics of each period of the volume control signal S_ADJ.

In other embodiments, the clock signal providing unit 122 may include a plurality of clock signals, and the plurality of clock signals have different frequency values selectable according to practical demands. In other embodiments, the clock signal providing unit 122 may select a clock signal with a proper frequency value according to the volume control signal S_ADJ, so that it can be provided to the sampling unit 121 for sampling of the audio control signal S_ADJ.

In step S210 and step S220, the high level counting unit 124 and the low level counting unit 125 of the volume control signal detecting module 12 may calculate the time period occupied respectively by a high level signal and a low level signal of each period of the volume control signal S_ADJ, which means the high level counting unit 124 and the low level counting unit 125, respectively, calculates a high level signal time and a low level signal time of each period. The high level counting unit 124 and the low level counting unit 125 then respectively transmits the high level signal time and the low level signal time to the duty cycle counting unit 126. The duty cycle counting unit 126 then calculates the duty cycle of each period according to the previously described equation 1.

In step S120, the signal outputted by the volume control signal detecting module 12 is the plurality of volume adjusting values which the duty cycle percentage of each period of the volume control signal S_ADJ corresponds to. That is to say, the volume adjusting single generated by the volume control signal detecting module 12 according to the volume control signal S_ADJ is the duty cycle percentage of each period of the volume control signal S_ADJ. Different duty cycle percentages may correspond to one volume adjusting value. In the present embodiment, 128 volume adjusting values are used, which means 128 (2 to the $7^{th}$ power) volume adjusting values are available in the present embodiment. In other embodiments, adjustments may be made according to different demands, and should not be limited by that disclosed in the present disclosure.

In step S130, the volume adjusting module 11 generates an adjusted audio signal according to the volume adjusting signal (i.e., the plurality of volume adjusting values) and the audio signal S_Audio. In the present embodiment, the volume adjusting module 11 multiplies the volume adjusting signal (i.e., the plurality of volume adjusting values) with the amplitude of the audio signal S_Audio to obtain the adjusted audio signal.

[The Possible Effects of the Embodiments]

The audio control circuit as provided in the present disclosure is able to utilize a pulse width modulation signal for volume control, and only one single pin on the chip package is needed for the volume control, thus helping to lower the complexity of circuit design, and which, in addition to simplifying the design of perimeter circuits, also saves the cost.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. An audio control circuit, comprising:
  an input module configured to receive an audio signal;
  a volume control signal detecting module configured to receive an audio control signal, and including:
    a duty cycle calculating unit;
    a sampling unit configured to sample the audio control signal according to a clock signal, wherein a frequency value of the clock signal is greater than a frequency value of the audio control signal;
    a high level counting unit configured to calculate a high level signal time of each period of the audio control signal; and
    a low level counting unit configured to calculate a low level signal time of each period of the audio control signal, wherein the duty cycle calculating unit calculates a duty cycle percentage of each period of the audio control signal according to the high level signal time and the low level signal time, the volume control signal detecting module generating a volume adjusting signal according to the duty cycle percentage of each period of the audio control signal; and
  a volume adjusting module configured to receive the audio signal and the volume adjusting signal, and to generate an adjusted audio signal according to the audio signal and the volume adjusting signal;
  wherein the audio control signal is a pulse width modulation signal.

2. The audio control circuit according to claim 1, wherein the audio control circuit further comprises:
  a processing module configured to process a plurality of audio characteristics of the adjusted audio signal, and to output the processed adjusted audio signal; and
  an output module configured to receive the processed adjusted audio signal from the processing module and to output the processed adjusted audio signal.

3. The audio control circuit according to claim 1, wherein the volume control signal detecting module further includes:
  a clock signal providing unit configured to provide the clock signal to the sampling unit.

4. The audio control circuit according to claim 3, wherein the clock signal providing unit includes a plurality of clock signals, the plurality of clock signals including different frequency values respectively.

5. The audio control circuit according to claim 1, wherein the volume control signal detecting module further includes:
  a reset unit, configured to reset the high level counting unit, the low level counting unit and the duty cycle calculating unit, according to a high level signal value detected by the high level counting unit or a low level signal value detected by the low level counting unit.

6. The audio control circuit according to claim 1, wherein a frequency value of the audio control signal is greater than 20 KHz.

7. A volume adjusting method adopted for an audio control circuit, comprising:
  receiving an audio control signal and an audio signal;
  sampling the audio control signal according to a clock signal;
  calculating a high level signal time and a low level signal time of each period of the audio control signal, calculating a duty cycle percentage of each period of the audio control signal according to the high level signal time and the low level signal time, and providing a plurality of volume adjusting values corresponding to the duty cycle percentage of each period of the audio control signal; and
  adjusting a volume of the audio signal according to the volume adjusting values;
  wherein the audio control signal is a pulse width modulation signal.

* * * * *